United States Patent
Hsu et al.

(10) Patent No.: US 7,400,540 B2
(45) Date of Patent: Jul. 15, 2008

(54) PROGRAMMABLE MEMORY AND ACCESS METHOD FOR THE SAME

(75) Inventors: Jui-Cheng Hsu, Tai Pei (TW); Lin-Chien Chen, Hsin Chu (TW)

(73) Assignee: Sunplus Technology Co., Ltd., Hsin-Chu (TW)

(*) Notice: Subject to any disclaimer, the term of this patent is extended or adjusted under 35 U.S.C. 154(b) by 210 days.

(21) Appl. No.: 11/481,829

(22) Filed: Jul. 7, 2006

(65) Prior Publication Data
US 2007/0091689 A1    Apr. 26, 2007

(30) Foreign Application Priority Data
Oct. 26, 2005    (TW) .............. 94137411 A

(51) Int. Cl.
*G11C 7/06* (2006.01)
(52) U.S. Cl. .............. 365/189.07; 365/189.02; 365/189.05
(58) Field of Classification Search ........... 365/189.07, 365/189.02, 189.05
See application file for complete search history.

(56) References Cited

U.S. PATENT DOCUMENTS

| | | | |
|---|---|---|---|
| 4,130,900 A * | 12/1978 | Watanabe | 365/189.04 |
| 5,287,326 A * | 2/1994 | Hirata | 365/230.03 |
| 5,331,600 A * | 7/1994 | Higuchi | 365/230.04 |
| 6,081,454 A * | 6/2000 | Ohuchi et al. | 365/185.22 |
| 6,724,657 B2 * | 4/2004 | Shukuri | 365/185.07 |
| 6,728,137 B1 | 4/2004 | Lin et al. | |
| 7,085,162 B2 * | 8/2006 | Nakamura et al. | 365/185.17 |
| 7,286,402 B2 * | 10/2007 | Nakamura et al. | 365/185.17 |
| 2003/0067822 A1 * | 4/2003 | Shukuri | 365/200 |
| 2005/0232039 A1 | 10/2005 | Hsu | |
| 2005/0253624 A1 | 11/2005 | Hsu | |

* cited by examiner

*Primary Examiner*—Tuan T. Nguyen
(74) *Attorney, Agent, or Firm*—Muncy, Geissler, Olds & Lowe, PLLC

(57) ABSTRACT

A programmable memory includes N number of one-time programmable (OTP) memory rows, an output module, a judge module, and a write-in module. The output module receives all data of the OTP memory rows and generates output data. The judge module receives the output data and write-in data and generates write-in control data according to the output data and the write-in data. When a bit datum of the output data is different to a bit datum of the write-in data, the bit of the write-in control data is enabled. The write-in module receives the write-in control data and stores a preset bit datum in an unprogrammed OTP memory cell of an OTP memory row corresponding to the enabled bit.

16 Claims, 11 Drawing Sheets

PROGRAMMABLE MEMORY AND ACCESS METHOD FOR THE SAME

BACKGROUND OF THE INVENTION (a) Field of the Invention

The invention relates to a programmable memory and its access method and, more particularly, to a programmable memory and its access method that perform multi-time programmable (MTP) recordings by N rows of one-time programmable (OTP) memory cells.

(b) Description of the Related Art

In the manufactures of a wafer, a super-twist nematic LCD (STN-LCD), or a thin-film transistor LCD (TFT-LCD), the finished products may have their respective electrical or optical characteristics. In order to improve the yield of manufacture, a typical method is to measure the actual characteristic parameters that are to be compared with target ones and then corrected by adjust procedures, where the adjust procedures are required to be easily implemented and permanently maintained. For example, the corrected values may be recorded by fuse burnout or by a non-volatile memory. The fuse may be burnt out by lasers or by applying high voltage/large current. Further, the non-volatile memory may be a one-time programmable memory (OTP memory) or a multi-time programmable memory (MTP memory), which are distinguished from each other according to their distinct architectures. Also, according to the difficulty of implement, the adjust procedures may be directly performed on the finished products or on memory cells to be affixed on the finished products.

It is clearly seen that the more flexibility is provided during manufacture if the adjust means, the fuse or the non-volatile memory, can be repeatedly set for several times. Thereby, a new corrected value can be set up once the specification is changed. However, compared with a one-time programmable memory cell such as a fuse, a multi-time programmable memory such as an EPROM, an EEPROM, or a flash memory requires additional circuits or complex fabrication processes to result in a high fabrication cost. Moreover, the yield of the multi-time programmable memory is closely related to semiconductor processes manipulated in a semiconductor factory, and thus the capacity risk is increased.

Hence, if multi-time programmable recordings are achieved by one-time programmable memory cells, the manufacture process is simplified and the fabrication cost is reduced under the circumstance that the flexibility of multi-time settings is maintained.

FIG. 1 shows a block diagram illustrating a programmable memory architecture described in U.S. Pat. No. 6,728,137. Referring to FIG. 1, multiple sets of one-time programmable memory blocks 15 are used in a programmable memory 10 to achieve multi-time programmable recordings. The programmable memory 10 writes-in and reads out data through row decoders 12 and column decoders 13 controlled by a control circuit 11. However, the programmable memory 10 requires additional record elements 14 to record which programmable memory block has been programmed.

FIG. 2 shows a block diagram illustrating another programmable memory architecture described in U.S. Publication No. 20050232039. Referring to FIG. 2, a multi-time programmable memory 20, similar to the programmable memory 10 shown in FIG. 1, includes multiple sets of adjusting one-time programmable (OTP) memory blocks 22 to achieve multi-time programmable recordings. When new data are stored in one OTP memory block 22, a write device 21 of the programmable memory 20 may simultaneously set an OTP element 24, which is used for selection purpose, corresponding to the OTP memory block 22. That is, the record element 14 shown in FIG. 1 is replaced by the OTP element 24. Further, multiple selection devices 23 of the programmable memory 20 are used to output latest updated data.

FIG. 3 shows a block diagram illustrating another programmable memory architecture described in U.S. Publication No. 20050253624. Referring to FIG. 3, a multi-time programmable memory 30 is similar to the multi-time programmable memory 20 shown in FIG. 2, where multiple sets of adjusting one-time programmable (OTP) memory blocks 22 are used to achieve multi-time programmable recordings. However, the OTP element 24 shown in FIG. 2 is replaced by multiple judge devices 34, as shown in FIG. 3. Hence, additional recordings about OTP element 24 are no longer needed.

Usually, since the destructive fuse structure functioning as the OTP cell is typically burnt out by lasers or by applying high voltage/large current, large areas must be reserved for spreading the fuse structure to avoid influencing surrounding circuits. On the other hand, if a typical charge capacitor type OTP memory is used, its stored data may be lost under adverse circumstances such as high temperature, fierce electromagnetic field or high intensity illumination, and thus the set corrected values are no longer permanently preserved. Under the circumstance, specific treatments on circuit design are needed, such as increase of voltage-regulated capacitors, voltage-limiting/current-limiting for power source, or formation of metallic shield layers used in IC layout. However, such remedies may result in a larger area of each OTP memory bit for several times when compared with each conventional MTP memory bit. Besides, the larger the number of bits to be programmed, the higher the opportunity of the occurrence of programmed failures becomes. For example, if the intensity of applied voltage/current is insufficient, the destructive fuse structure will not be burnt out. Moreover, if the intensity of applied voltage/current is great, the fierce stress due to repeated burn out operations may cause damages to an IC chip.

When we compare the three memory architecture described above, it is found they have similarities in their write-in procedures. Specifically, no matter how large the amount of the bit data are to be changed, a new set of OTP memory cells is always provided for storing the changed bit data. For example, even only one bit is to be changed, a new set of OTP memory cells must be provided. Further, in the above three memory architectures, each memory cell set has identical number of memory cells, and the output data contain bit data of only one memory cell set.

BRIEF SUMMARY OF THE INVENTION

Hence, an object of the invention is to provide a programmable memory and its access method capable of reducing the number of programmed recording times, so that the required memory bits for storing correction parameters of finished products is minimized, and that the set accuracy of correction parameters is improved.

Another object of the invention is to provide a programmable memory and its access method that use prejudge on each bit datum to determine whether the bit datum is needed to be changed.

According to the invention, a programmable memory includes N number of one-time programmable (OTP) memory rows having multiple OTP memory cells, an output module, a judge module, and a write-in module. The output module receives N sets of data of the OTP memory rows and generates N-bit output data, wherein each bit datum of the output data is generated by means of a calculation performed on all data of an OTP memory row corresponding to the bit datum. The judge module receives the N-bit output data and N-bit input data and generates N-bit write-in control data according to the output data and the input data. When the $M_{th}$ bit datum of the output data is different to the $M_{th}$ bit datum of the input data, the $M_{th}$ bit of the write-in control data is enabled. The write-in module receives the N-bit write-in control data and stores a preset bit datum in an unprogrammed OTP memory cell of an OTP memory row if the corresponding bit of the write-in data is enabled.

Through the design of the invention, since prejudge is performed on the input data and the stored data for each bit to determine whether an updated operation is needed, the tolerance of repeat programmable operations is increased, and the programming time and the possibility of programming failures are all reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The programmable memory and access method for the same of the invention will be described with reference to the accompanying drawings.

Figure 1:
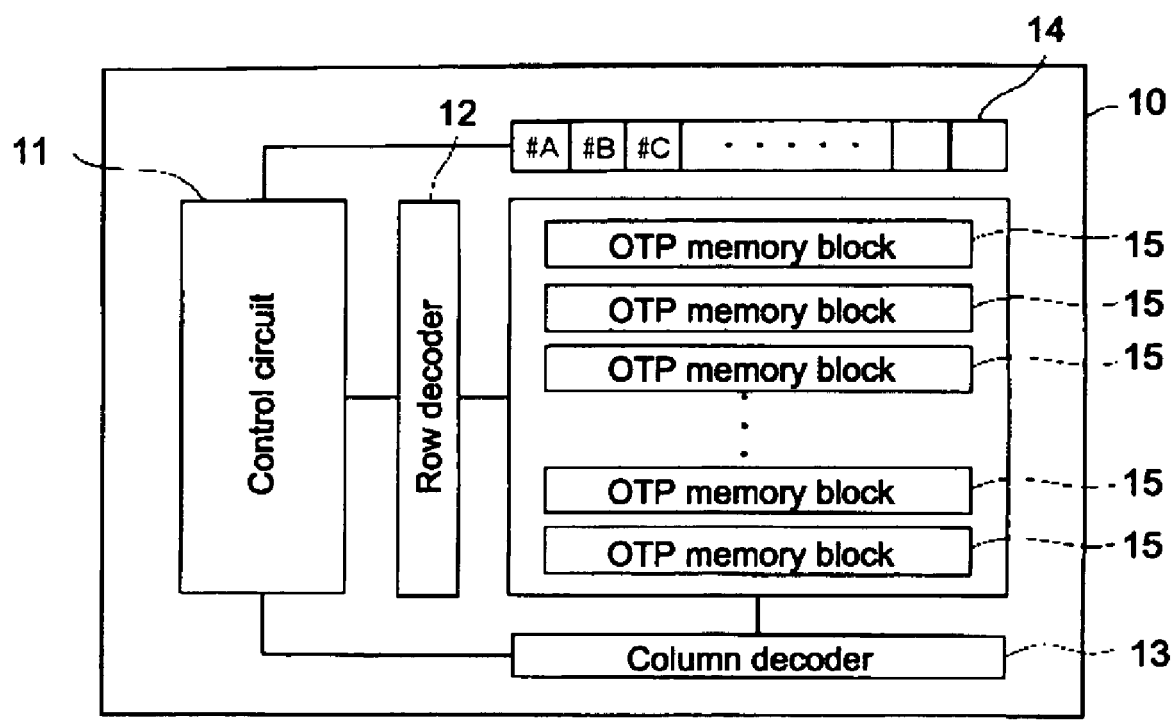
FIG. 1 shows a block diagram illustrating a programmable memory architecture described in U.S. Pat. No. 6,728,137.
Figure 2:
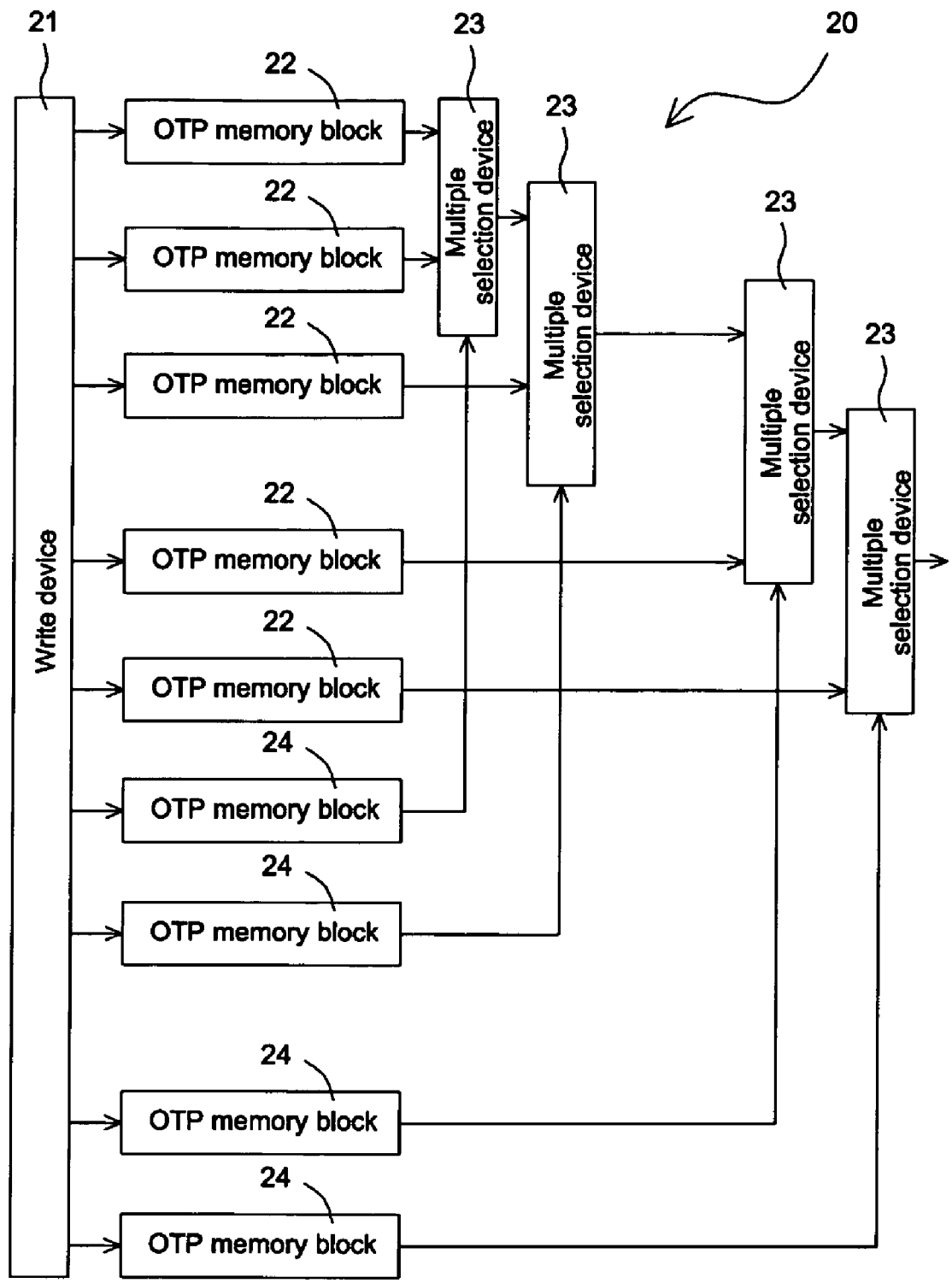
FIG. 2 shows a block diagram illustrating another programmable memory architecture described in U.S. Publication No. 20050232039.
Figure 3:
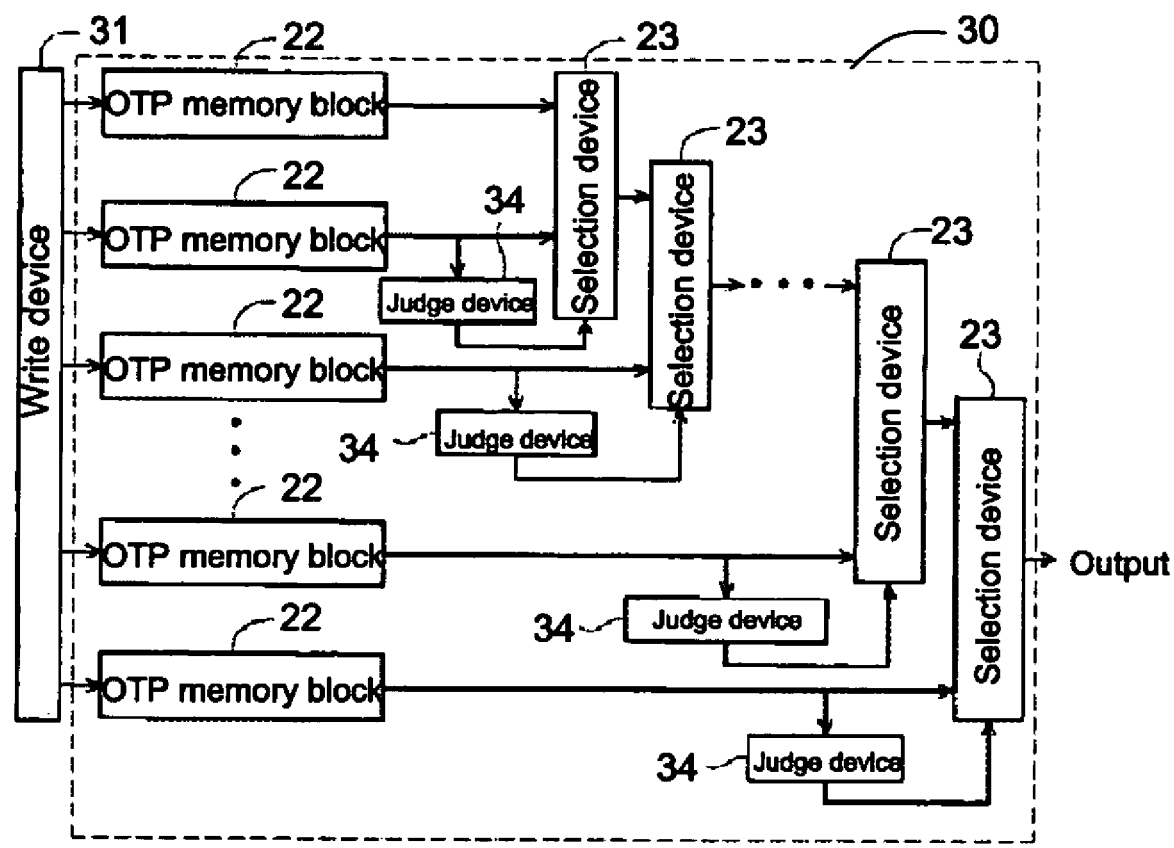
FIG. 3 shows a block diagram illustrating another programmable memory architecture described in U.S. Publication No. 20050253624.
Figure 4:
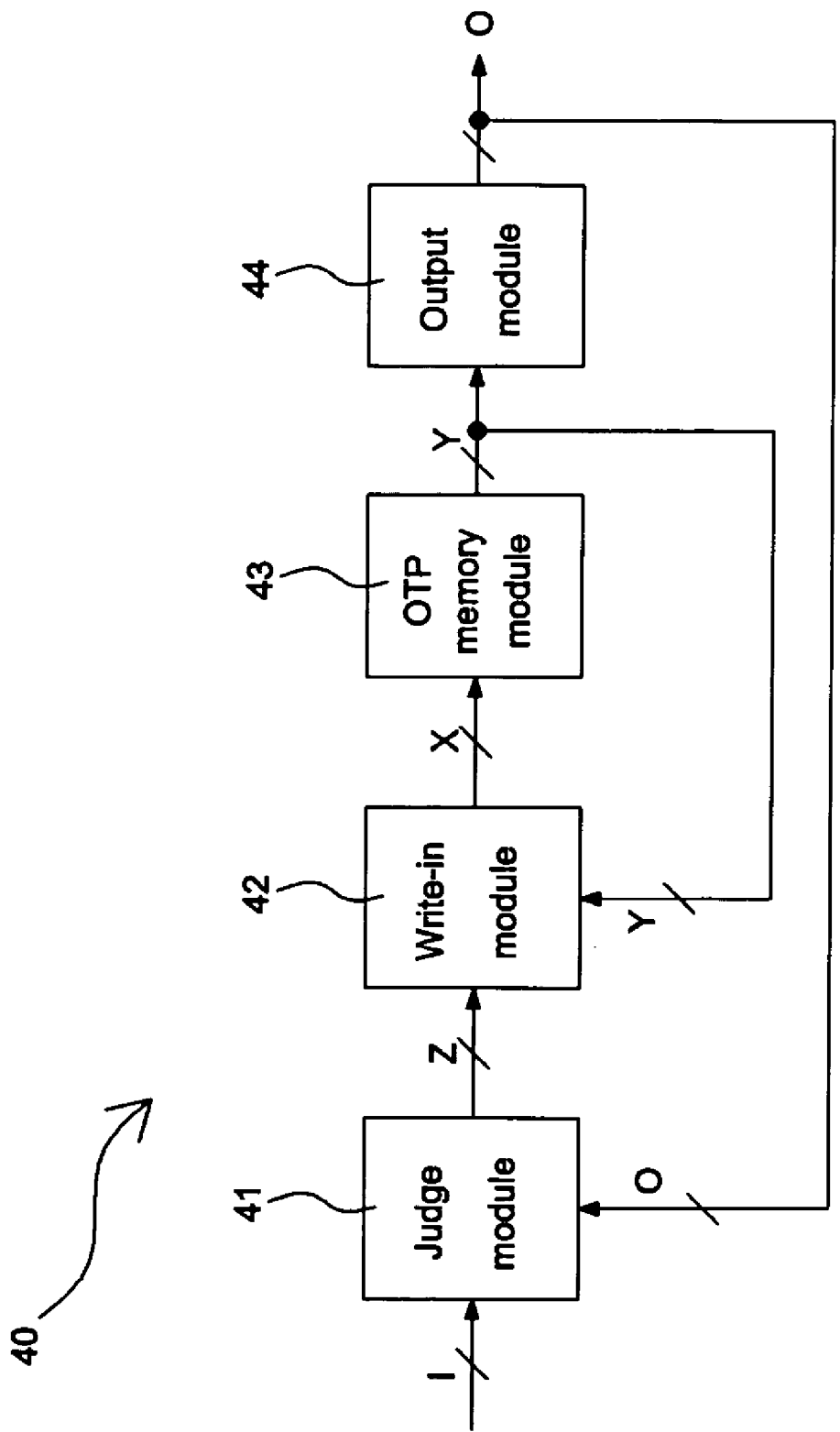
FIG. 4 shows a block diagram illustrating a programmable memory of the invention.

FIG. 4 shows a block diagram illustrating a programmable memory of the invention. Referring to FIG. 4, the programmable memory 40 includes a judge module 41, a write-in module 42, a one-time programmable (OTP) memory module 43, and an output module 44.

The OTP memory module 43 includes N rows of OTP memory cells, with each row having multiple OTP memory cells. The output module 44 receives N-sets output data Y of all OTP memory cells in the OTP memory module 43 and generates N-bits data 0 by carrying out operations. Specifically, each row of the OTP memory cells may generate one bit output datum. For example, in case all data of one OTP memory row include an odd number of value 1, the output bit datum of that row is value 1; on the contrary, in case all data of one OTP memory row include an even number of value 1, the output bit datum of that row is value 0.

The judge module 41 receives each bit datum of the N-bits input data I and N-bits output data O and then compares them to generate N-bits write-in control data Z. If the $M_{th}$ bit datum of input data I is different to that of the output data O, this means a different bit datum is needed to be written-in, and thus the write-in control data Z for that $M_{th}$ bit is enabled (for example, enabled as logic "H"). On the contrary, If the $M_{th}$ bit datum of input data I is the same as that of the output data O, this means the bit datum is not needed to be written-in, and thus the write-in control data Z for that $M_{th}$ bit are disabled (for example, enabled as logic "L"). The write-in module 42 receives N-sets output data Y of the N rows of OTP memory cells and the N-bits write-in control data Z, and, when at least one bit of the write-in control data Z are enabled, it also stores a preset datum (such as value 1) in one of the OTP memory cells that has not been programmed yet. For example, the value 0 of the output data Y of the OTP memory cells indicates its address corresponding memory cell has not been programmed yet.

Figure 5:
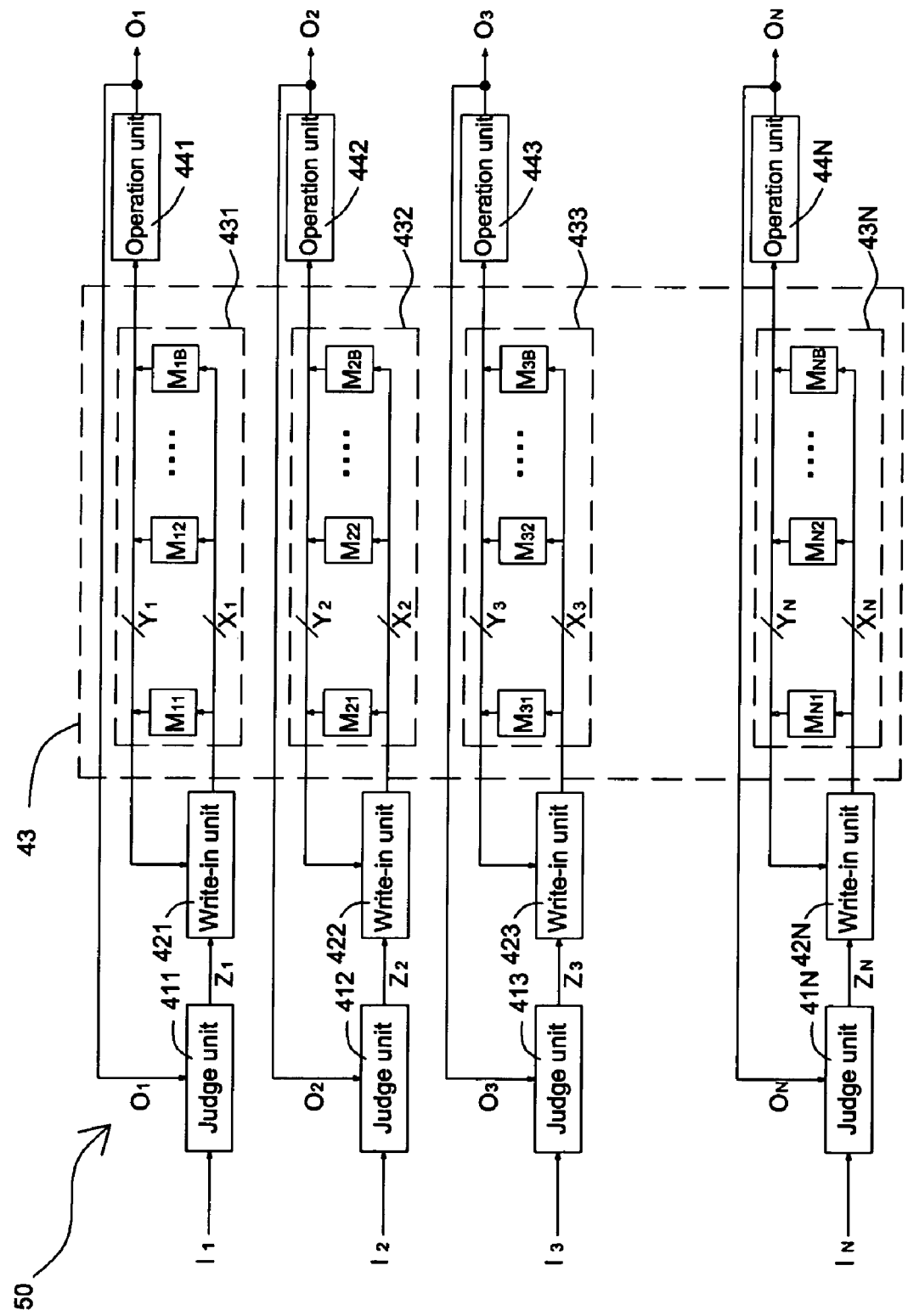
FIG. 5 shows a block diagram illustrating a first embodiment of the invention.

FIG. 5 shows a block diagram illustrating a first embodiment of the invention. Referring to FIG. 5, the programmable memory 50 includes N judge units 411-41N, N write-in units 421-42N, N rows of OTP memory cells 431-43N, and N operation units 441-44N. The N judge units 411-41 N constitute the judge module 41, the N rows of OTP memory cells 431-43N constitute the OTP memory module 43, and the N operation units 441-44N constitute the output module 44, as shown in FIG. 4.

The N judge units 411-41N respectively receive N-bits input data $I_1$-$I_N$ and N-bits output data $O_1$-$O_N$ and generate N-bits write-in control data $Z_1$-$Z_N$. If an input datum $I_1$ is the same as an output datum $O_1$, the write-in control datum $Z_1$ is disabled (or set as value 0), which means the bit datum needs not be changed. On the contrary, if the input datum $I_1$ is different to the output datum $O_1$, the write-in control datum $Z_1$ is enabled (or set as value 1), which means the bit datum needs being changed. The rest datum $I_2$ to datum $I_N$ may be deduced by analogy.

The N write-in units 421-42N respectively receives N-bits write-in control data $Z_1$-$Z_N$ and N-sets output data $Y_1$-$Y_N$ of N rows of OTP memory cells 431-43N. Also, when at least one of the write-in data $Z_1$-$Z_N$ are enabled, a preset value are stored in one of the OTP memory cells that have not been programmed yet. For example, when the input datum $I_1$, is different to the output datum $O_1$, the write-in control datum $Z_1$ is enabled. Take for example, if the OTP memory row 431 has three OTP memory cells whose output bit data are [100], the write-in bit data $X_1$ generated by the write-in unit 421 are [010], and the preset data are stored in the OTP memory cell $M_{12}$.

In this embodiment, each of the N number of OTP memory rows 431-43N has B number of OTP memory cells for storing data.

The N operation units 441-44N respectively receive N-sets output data $Y_1$-$Y_N$ of the N rows of OTP memory cells 431-43N. Also, one operation unit calculates the number of value 1 in the output data $Y_1$-$Y_N$ of one corresponding OTP memory row to generate output data $O_1$-$O_N$. The operation unit may be an exclusive OR gate, an exclusive NOR gate, a binary adder, or other device capable of performing the same function.

Figure 6:
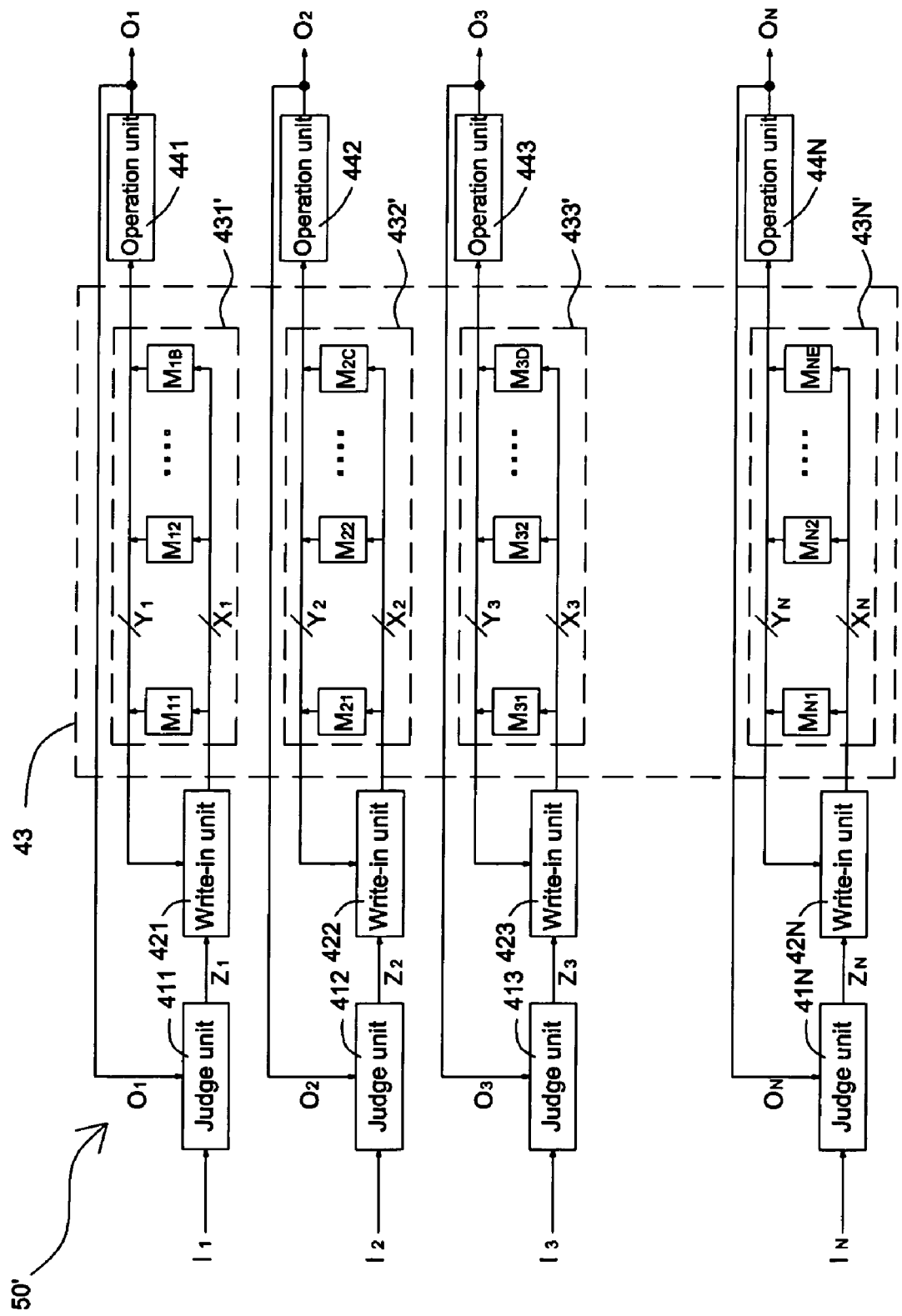
FIG. 6 shows a block diagram illustrating a second embodiment of the invention.

FIG. 6 shows a block diagram illustrating a second embodiment of the invention. Referring to FIG. 6, the programmable memory 50', similar to the programmable memory 50, includes N judge units 411-41N, N write-in units 421-42N, N rows of OTP memory 431-43N, and N operation units 441-44N. The major difference is that, in the programmable memory 50', each of the OTP memory rows 431'-43N' can have a different number of OTP memory cells. For example, if a first OTP memory row has B number of OTP memory cells, then a second OTP memory row has C number of OTP memory cells, where the value of C is not equal to that of B. B and C are nature numbers.

Typical methods used to control the characteristics of a finished product to meet a standard specification include plans for pre-fabrication (selection of proper raw materials and fabrication methods), controls in manufacture, and remedies for post-fabrication. The remedies aim to allow averages of specific characteristic parameters to approach the center of allowable ranges of a standard specification and meanwhile lower the standard deviation, so that the yield of finished products is improved. According to statistic principles, the characteristics of massive finished products often represent conforming to Gaussian distribution; that is, most of the finished products are distributed at the average location of the distribution curve, and rarely few of them are distributed at outside of a range with three times standard deviation. Further, in an OTP memory, the probability of changing the datum of a least significant bit (LSB) is higher than that of a most significant bit (MSB). Hence, more OTP memory cells should be provided to satisfy the demand of the least significant bit (LSB) to effectively increase the tolerance of repeat programmable operations. Therefore, in the programmable memory 50' according to the second embodiment, part of the memory cells in the OTP memory row having lower changing probability may be omitted or may turn to be provided for the OTP memory row having higher altering probability. Thereby, the required number of OTP memory cells can be reduced.

Figure 7:
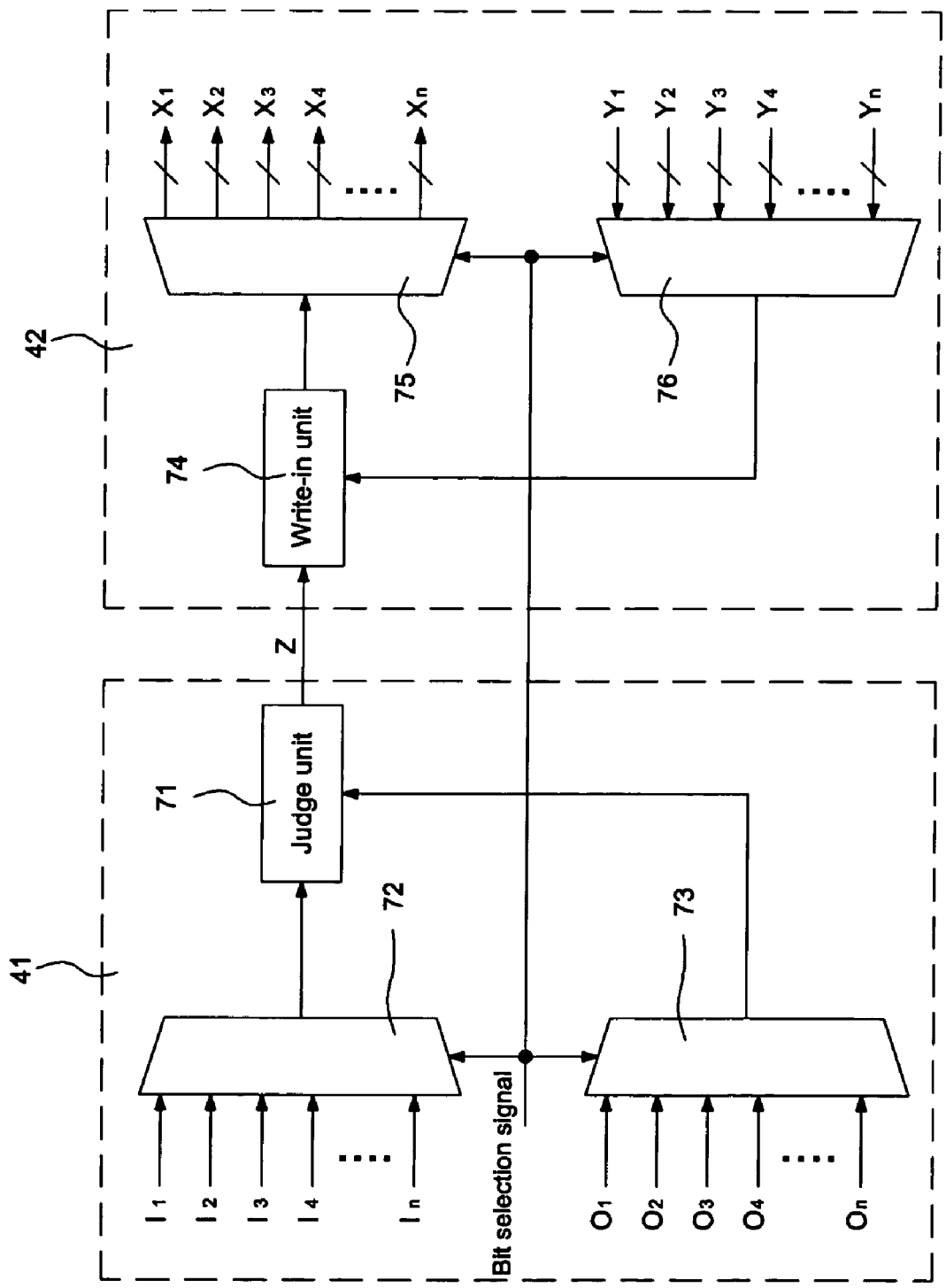
FIG. 7 shows a block diagram illustrating another embodiment of the judge module and the write-in module according to the invention.

FIG. 7 shows a block diagram illustrating another embodiment of the judge module and the write-in module according to the invention. In FIG. 5 and FIG. 6, the judge module 41 of a programmable memory includes N judge units 411-41N. In comparison, the judge module 41 of a programmable memory contains only one judge unit 71, and it additionally uses a first multiplexer 72 and a second multiplexer 73 to select data of different bits. The first multiplexer 72 receives N-bits input data $I_1$-$I_N$ and outputs one bit data according to a bit selection signal. The second multiplexer 73 receives N-bits output data $O_1$-$O_N$ and outputs one bit data according to the bit selection signal. The judge unit 71 receives and then compares the output data of the first and the second multiplexers 72 and 73 to generate a write-in control datum as the write-in control data Z, and the write-in control data Z may be 1-bit data.

Besides, unlike N write-in units 421-42N shown in FIG. 5 and FIG. 6, the write-in module 42 shown in FIG. 7 includes only one write-in unit 74, and it additionally uses a demultiplexer 75 and a third multiplexer 76 to select data of different bits. The third multiplexer 76 receives N-sets output data $Y_1$-$Y_N$ from N sets of OTP memory rows and outputs one set of them according to the bit selection signal. The write-in unit 74 receives the write-in control data Z (write-in control datum) and generate a set of write-in data according to the output data of the third multiplexer 76 when the write-in control data Z are enabled. The demultiplexer 75 receives the write-in data and outputs them to their corresponding programmable memory rows according to the bit selection signal.

Figure 8:
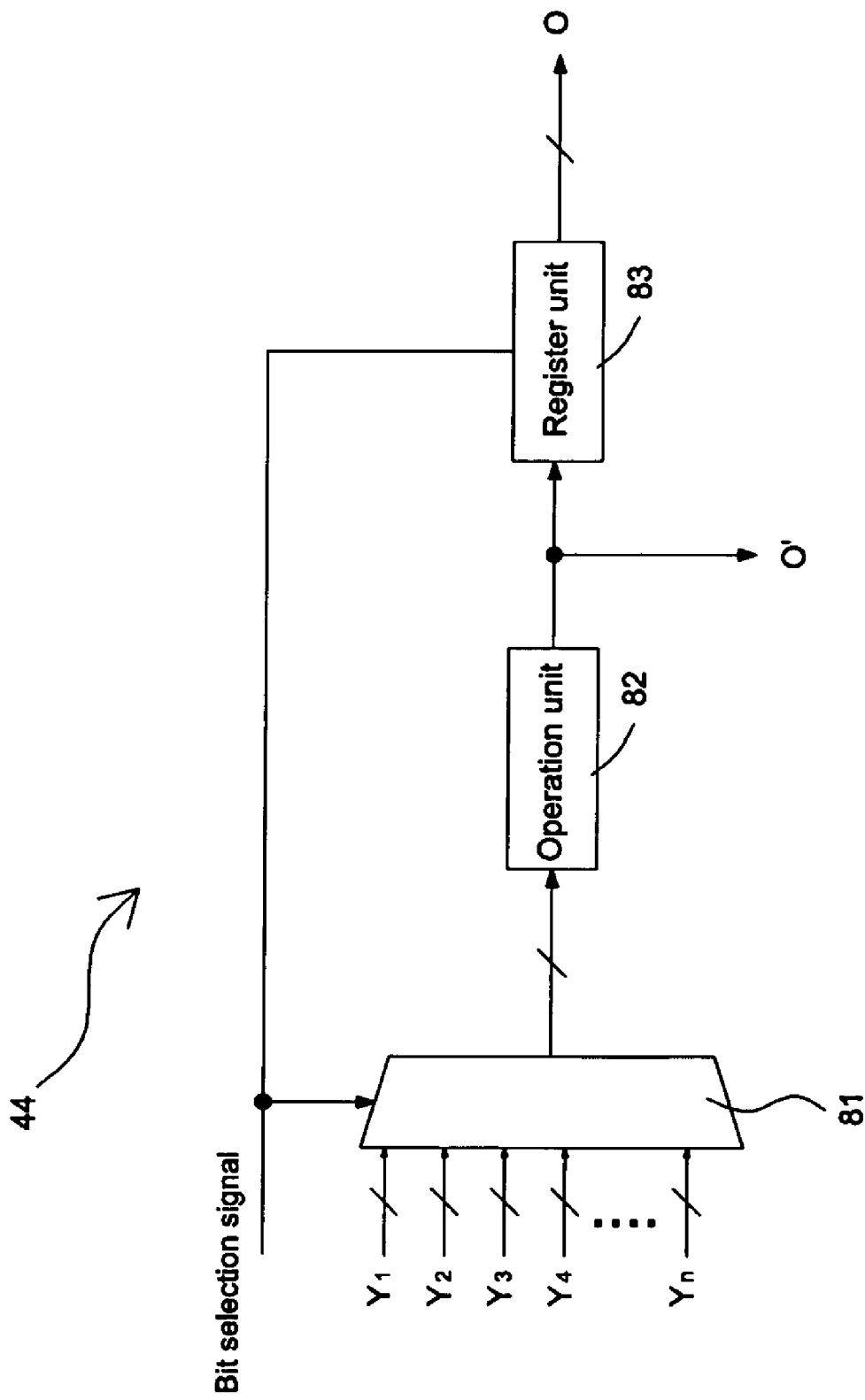
FIG. 8 shows a block diagram illustrating another embodiment of the output module according to the programmable memory of the invention.

FIG. 8 shows a block diagram illustrating another embodiment of the output module according to the programmable memory of the invention. Unlike N operation units 441-44N shown in FIG. 5 and FIG. 6, the output module 44 shown in FIG. 8 includes only one operation unit 82 and one register unit 83, and it also uses a multiplexer 81 to select data of different bits. The multiplexer 81 receives N-sets output data $Y_1$-$Y_N$ from N sets of OTP memory rows and outputs one set of them according to the bit selection signal. The operation unit 82 receives the output data of the multiplexer 81 to generate a bit data and stores the bit data in its corresponding bit address of the register 83. This can be done by summing up the output data of the multiplexer 81 and then choosing the lowest bit number as the bit data, or by performing an XOR operation on the output data of the multiplexer 81. Alternatively, the operation unit 82 may calculate the number of value 1 in the output data of the multiplexer 81, and, in case the output data of the multiplexer 81 contain an odd number of value 1, the output bit datum is value 1; otherwise, the output bit datum is value 0. The output bit datum is stored in a bit address of the register 83 according to the bit select signal, and all the stored bit data are output as the N-bit output data $O_1$-$O_N$. The operation unit 82 may be an exclusive OR gate, an exclusive NOR gate, a binary adder, or other device capable of performing the same function.

Figure 9:
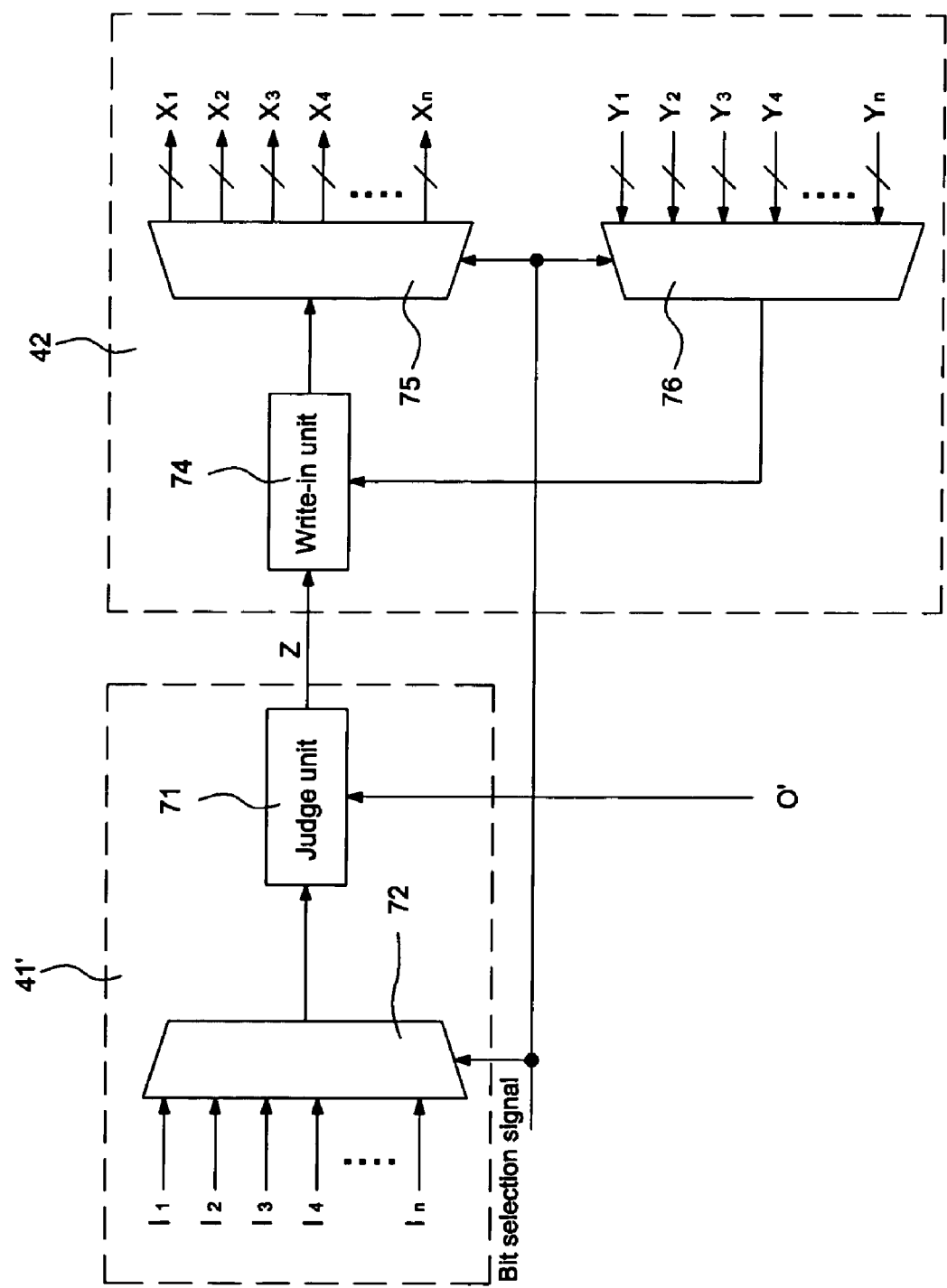
FIG. 9 shows a block diagram illustrating another embodiment of the judge module and the write-in module according to the programmable memory of the invention.

FIG. 9 shows a block diagram illustrating another embodiment of the judge module and the write-in module according to the programmable memory of the invention. First, referring back to FIG. 7, the judge module 41 includes a judge unit 71, and it also uses a first and a second multiplexers 72 and 73 to select data of different bits. Since the second multiplexer 73 shown in FIG. 7 and the multiplexer 81 of the output module shown in FIG. 8 have identical functions, the second multiplexer 73 for the judge module 41' can be omitted when the output module shown in FIG. 8 is used, as shown in FIG. 9. Thus, the judge unit 71 of the judge module 41' may directly receive the output data of the first multiplexer 72 and the output O' of the multiplexer 81 in the output module.

Figure 10:
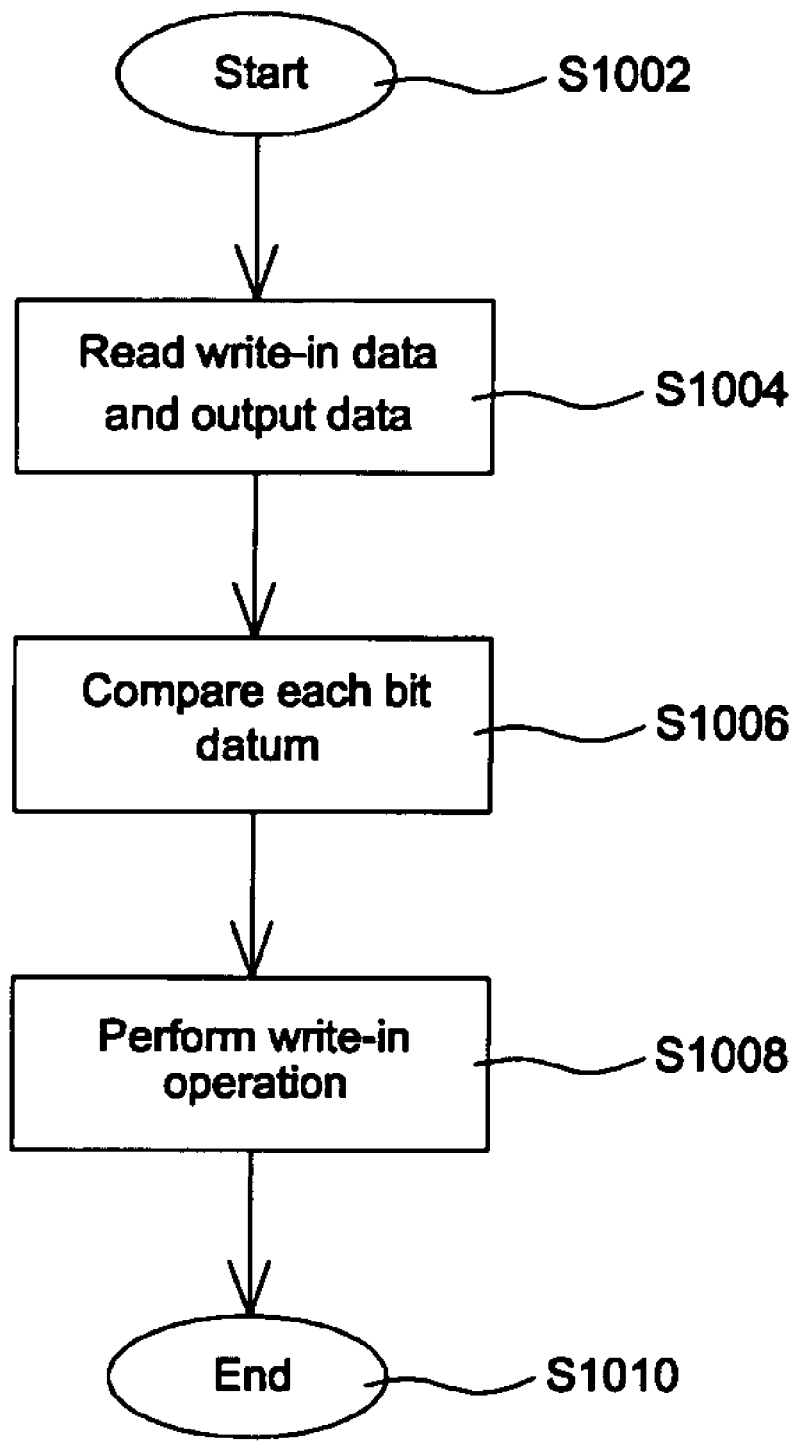
FIG. 10 shows a flow chart illustrating a write-in procedure for an OTP memory according to the invention.

FIG. 10 shows a flow chart illustrating a write-in procedure for an OTP memory according to the invention, where the OTP memory consists of N rows of OTP memory cells.

Step S1002: Start.

Step S1004: Read out N-bit write-in data and N-bit output data.

Step S1006: Compare each bit datum of the N-bit write-in data with each bit datum of the N-bit output data.

Step S1008: Perform write-in operation after the bit datum comparison is made. When the bit datum of the write-in data is the same as that of the output data, the bit datum is not stored in an OTP memory cell of an OTP memory row corresponding to that bit. On the contrary, when the bit datum of the write-in data is different to that of the output data, a preset bit datum (such as 1) is stored in an unprogrammed OTP memory cell of an OTP memory row corresponding to that bit.

Step S1010: End.

Figure 11:
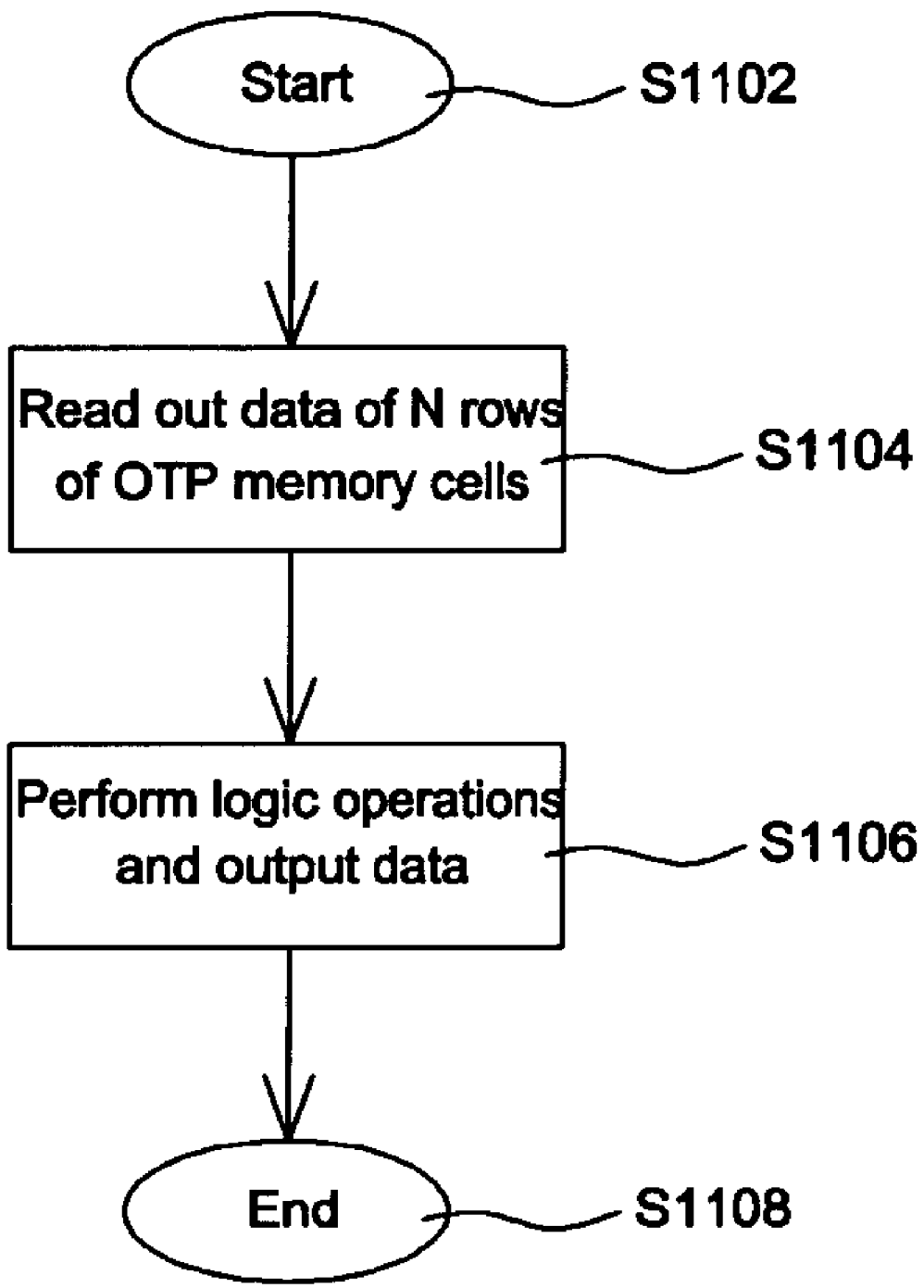
FIG. 11 shows a flow chart illustrating a read out procedure for OTP memory according to the invention.

FIG. 11 shows a flow chart illustrating a read out procedure for OTP memory according to the invention, where the OTP memory consists of N rows of OTP memory cells.

Step S1102: Start.

Step S1104: Read out data of N rows of OTP memory cells.

Step S1106: Perform logic operations on all data of each OTP memory row to obtain the number of value 1 in one OTP memory row. If the number is an odd number, the output bit datum is value 1; otherwise, the output bit datum is value 0.

Step S1108: End.

Through the design of the invention, prejudge is performed on the input data and stored data for each bit to determine whether an updated write-in value is needed. Since the write-in value is either value 1 or value 0, there is a probability of 50 percent that a re-write operation is not needed. Therefore, the tolerance of repeat programmable operations is increased, and the programming time and the possibility of programming failures are all reduced. Referring back to conventional memory architectures, it is found all of them have the same number of memory cells in a memory cell set, and the output data contain bit data of only one memory cell set. On the contrary, the programmable memory of the invention may output N-bit data by N rows of OTP memory cells, and each row may have a different number of memory cells. Further, according to the invention, the bit is a unit for write-in or read out operations, and the output bit data are output after calculations on all data stored in each OTP memory row have been performed.

Further, in conventional memory architectures, the number of OTP memory cell sets equals the number of rewrite times, and the bit number is determined by the width of one OTP memory cell set. On the contrary, according to the invention, the number of the OTP memory rows equals the bit number of stored data in the programmable memory, and the number of rewrite times is determined by the cell number of one OTP memory row and data to be recorded. The minimum number of record times equals the cell number of one OTP memory row.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. For example, the second multiplexer 73 shown in FIG. 7 can be omitted, and then the output signals of the multiplexer 81 may be directly provided for the judge unit. Therefore, the scope of the appended claims should be accorded the broadest interpretation so as to encompass all such modifications and similar arrangements.

What is claimed is:

1. A programmable memory, comprising:
    N number of one-time programmable (OTP) memory rows, each OTP memory row having multiple OTP memory cells, wherein N is a positive integer;
    an output module for receiving all data of the N number of OTP memory rows to generate N-bit output data, wherein each bit datum of the output data is generated by means of a calculation performed on all data of each OTP memory row corresponding to the bit datum;
    a judge module for receiving the output data and N-bit input data and generating N-bit write-in control data according to the output data and the input data, wherein, when the $M_{th}$ bit datum of the output data is different to the $M_{th}$ bit datum of the input data, the $M_{th}$ bit datum of the write-in control data is enabled, and otherwise the $M_{th}$ bit datum of the write-in control data is disabled, where M is a positive integer from 1 to N; and
    a write-in module for receiving the write-in control data and recording a preset bit datum in an unprogrammed OTP memory cell of the corresponding $M_{th}$ OTP memory row when the $M_{th}$ bit datum of the write-in control data is enabled.

2. The programmable memory according to claim 1, wherein the N number of OTP memory rows have different numbers of the OTP memory cells.

3. The programmable memory according to claim 1, wherein the N number of OTP memory rows have identical numbers of the OTP memory cells.

4. The programmable memory according to claim 1, wherein the output module has N number of operation units, and each operation unit receives all output data of its corresponding OTP memory row and generates one bit datum of the output data.

5. The programmable memory according to claim 1, wherein the output module comprises:
    a first multiplexer for receiving N sets of the data of the N number of OTP memory rows and selecting one set of the output data as operation data according to a bit selection signal;
    an operation unit for receiving the operation data output from the first multiplexer and generating an operational bit datum; and
    a N-bit register for storing the operational bit datum according to the bit selection signal and outputting the stored data as the N-bit output data.

6. The programmable memory according to claim 5, wherein the judge module comprises:
    a second multiplexer for receiving the input data and selecting one bit datum of the input data as an input bit datum according to the bit selection signal; and
    a judge unit for receiving the input bit datum output from the second multiplexer and the operation bit datum for output a write-in control signal as the write-in control data, wherein the write-in control signal is enabled when the input bit datum is different to the operation bit datum.

7. The programmable memory according to claim 6, wherein the write-in module comprises:
    a third multiplexer for receiving the N sets of the data of the N number of OTP memory rows and selecting one set of the data as memory cell data according to the bit selection signal;
    a write-in unit for receiving the write-in control data and the memory cell data output from the third multiplexer and generating a write-in signal when the write-in control data is enabled; and
    a demultiplexer for receiving the write-in signal output from the write-in unit and storing the write-in signal in an unprogrammed OTP memory cell of one OTP memory row corresponding to the write-in signal according to the bit selection signal.

8. The programmable memory according to claim 4, wherein the judge module comprises N number of judge units for receiving the N-bit input data and the N-bit output data to generate the N-bit write-in control data, wherein the $M_{th}$ bit datum of the write-in control data is enabled when the $M_{th}$ bit datum of the input data is different to the $M_{th}$ bit datum of the output data.

9. The programmable memory according to claim 8, wherein the write-in module has N number of write-in units for receiving the N-bit write-in control data and the N sets data of N number of OTP memory rows and storing the preset datum in an unprogrammed OTP memory cell of the corresponding OTP memory row when the bit datum corresponding to the write-in control data is enabled.

10. The programmable memory according to claim 4, wherein the judge module comprises:
    a first multiplexer for receiving N-bit input data and selecting one bit datum of the input data as an input bit datum according to a bit selection signal;
    a second multiplexer for receiving the N-bit output data and selecting one bit datum of the output data as an output bit datum; and a judge unit for receiving the input bit datum output from the first multiplexer and the output bit datum output form the second multiplexer to outputting a write-in control signal as the write-in control data, wherein the write-in control signal being enabled when the input bit datum is different to the output bit datum.

11. The programmable memory according to claim 10, wherein the write-in module comprises:

a third multiplexer for receiving the N sets of data of the N number of OTP memory rows and selecting one set data as memory cell data according to the bit selection signal;

a write-in unit for receiving the write-in control data and the memory cell data output from the third multiplexer and generating a write-in signal when the write-in control data is enabled; and a demultiplexer for receiving the write-in signal of the write-in unit and storing the write-in signal in an unprogrammed OTP memory cell of one OTP memory row corresponding to the write-in signal according to the bit selection signal.

12. A memory module of a programmable memory, the programmable memory having a plurality of one-time programmable (OTP) memory rows, each OTP memory row comprising:

a one-time programmable (OTP) memory unit having multiple OTP memory cells;

an output unit for receiving output signals of all the OTP memory cells of the OTP memory unit and generating an output bit datum;

a judge module for receiving an input bit datum and the output bit datum and generating a write-in control signal, wherein the write-in control signal is enabled when the input bit datum is different to the output bit datum; and a write-in unit for storing data in an unprogrammed OTP memory cell of an OTP memory unit when the write-in control signal is enabled.

13. The memory module according to claim 12, wherein the OTP memory units have different numbers of the OTP memory cells.

14. The memory module according to claim 12, wherein the OTP memory units have identical numbers of the OTP memory cells.

15. The memory module according to claim 12, wherein the programmable memory has N number of one-time programmable (OTP) memory rows and records N-bit data.

16. A write-in method used for storing N-bit input data in a programmable memory having N rows of one-time programmable (OTP) memory cells, the method comprising the steps of:

reading out the N-bit input data and N-bit output data of the programmable memory;

comparing each bit datum of the N-bit input data with each corresponding bit datum of the N-bit output data; and performing write-in operations for storing a preset value in an unprogrammed OTP memory cell of a OTP memory row when the corresponding bit datum of the write-in data is different to that of the output data.

* * * * *